(12) United States Patent
Garcia et al.

(10) Patent No.: US 10,026,752 B2
(45) Date of Patent: Jul. 17, 2018

(54) STACKED SOI LATERAL BIPOLAR TRANSISTOR RF POWER AMPLIFIER AND DRIVER

(71) Applicant: International Business Machines Corporation, Armonk, NY (US)

(72) Inventors: Alberto Valdes Garcia, Chappaqua, NY (US); Tak H. Ning, Yorktown Heights, NY (US); Jean-Olivier Plouchart, New York, NY (US); Ghavam G. Shahidi, Pound Ridge, NY (US); Jeng-Bang Yau, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/249,430

(22) Filed: Aug. 28, 2016

(65) Prior Publication Data
US 2018/0061853 A1   Mar. 1, 2018

(51) Int. Cl.
| | | |
|---|---|---|
| *H01L 27/12* | (2006.01) | |
| *H01L 29/06* | (2006.01) | |
| *H01L 29/10* | (2006.01) | |
| *H01L 29/08* | (2006.01) | |
| *H01L 23/535* | (2006.01) | |
| *H03F 3/195* | (2006.01) | |

(Continued)

(52) U.S. Cl.
CPC ........ *H01L 27/1203* (2013.01); *H01L 23/535* (2013.01); *H01L 29/0649* (2013.01); *H01L 29/0808* (2013.01); *H01L 29/0821* (2013.01); *H01L 29/1008* (2013.01); *H03F 3/195* (2013.01); *H03F 3/213* (2013.01); *H03F 3/26* (2013.01)

(58) Field of Classification Search
CPC ......... H01L 27/12; H01L 29/06; H01L 29/10; H01L 29/08; H01L 23/535; H03F 3/195; H03F 3/213; H03F 3/26
See application file for complete search history.

(56) References Cited

U.S. PATENT DOCUMENTS

| | | | |
|---|---|---|---|
| 6,972,466 B1 * | 12/2005 | Liang | H01L 21/84 257/338 |
| 9,263,583 B2 | 2/2016 | Cai et al. | H01L 29/785 |
| 2012/0314485 A1 * | 12/2012 | Cai | G11C 11/41 365/156 |

OTHER PUBLICATIONS

A. Chakrabarti et al., "High power, high efficiency stacked mm-wave class-E-like power amplifiers in 45 nm SOI CMOS", CICC paper 3-3, pp. 1-4 (2012).

(Continued)

*Primary Examiner* — Asok K Sarkar
*Assistant Examiner* — Dmitriy Yemelyanov
(74) *Attorney, Agent, or Firm* — Ido Tuchman; Louis J. Percello

(57) ABSTRACT

An amplifier circuit including a substrate layer and a plurality of lateral bipolar junction transistors positioned entirely above the substrate. The lateral bipolar junction transistors include a plurality of monolithic emitter-collector regions coplanar to each other. Each of the emitter-collector regions is both an emitter region of a first bipolar junction transistor a collector region of a second bipolar junction transistor from the lateral bipolar junction transistors. Accordingly, the lateral bipolar junction transistors are electrically coupled in series circuit at the emitter-collector regions.

20 Claims, 11 Drawing Sheets

(51) Int. Cl.
    *H03F 3/213*     (2006.01)
    *H03F 3/26*      (2006.01)

(56) References Cited

OTHER PUBLICATIONS

M.-F. Lei, et al., "Design and analysis of stacked power amplifier in series-input and series-output configuration," IEEE Transactions on Microwave Theory and Techniques, vol. 55, No. 12, pp. 2802-2812, (Dec. 2007).
K. Datta, et al., "Analysis, design and implementation of mm-Wave SiGe stacked class-E power amplifiers", RFIC Symp., paper RTU1B-2, pp. 275-278 (2013).
Hong-Yeh Chang, et al., "Design and Analysis of a DC-43.5-GHz Fully Integrated Distributed Amplifier Using GaAs HEMT—HBT Cascode Gain Stage", IEEE Transactions on Microwave Theory and Techniques, vol. 59, No. 2, pp. 443-455, (Feb. 2011).
Chih-Chun Shen, et al., "A Broadband Stacked Power Amplifier Using 2-um GaAs HBT Process for C-band Applications", IEEE, paper 978-1-4244-2642-3/08, pp. 1-4 (2008).

\* cited by examiner

STACKED SOI LATERAL BIPOLAR TRANSISTOR RF POWER AMPLIFIER AND DRIVER

BACKGROUND

The present invention is directed toward semiconductor transistors, and more particularly to lateral bipolar junction transistors (BJTs) with emitter-collector regions.

From the mid to the late 1970's, there was a lot of excitement in the VLSI industry about the prospect of Integrated Injection Logic ($I^2L$). $I^2L$ is by far the densest circuit. It uses small sized devices, and requires one PNP per gate for current injection and only one NPN per fan-out. Thus an inverter with FO=3 takes only four transistors. The NPN transistors in an $I^2L$ circuit operate in the reverse-active mode. As a result, even with advanced self-aligned vertical Si-based BJT technology, $I^2L$ has minimum delays not much below one ns. This speed limitation, together with the rapid progress in complementary metal-oxide semiconductor (CMOS) scaling in the early 1980's, caused the demise of $I^2L$.

Many modern technologies, such as high-speed communications, radar applications, and millimeter wave (mm-wave) and THz imaging and sensing, require transistor operation in the hundreds of GHz. Silicon-on-insulator (SOI) complementary metal-oxide-semiconductor (CMOS) allows stacked NFET to use voltage supply higher than the bulk-FET drain junction breakdown voltage. This has allowed SOI-CMOS to be competitive for mmwave output power and efficiency. However, advanced CMOS breakdown is now limited by the gate dielectric breakdown and hot carriers. Therefore, advanced CMOS using a VDD supply of 1V or less limits the generation of power beyond 100 GHz.

SiGe-BJT are also competitive but are currently limited by the number of devices that can be stacked (typically two), because of the use of bulk Si substrates. The maximum collector-to-emitter voltage that can be used in a stacked configuration is limited by the collector-to-substrate breakdown voltage. As a vertical SiGe heterojunction bipolar transistor (HBT) is driven to higher currents, the transistor speed and circuit speed increase. However, once the current exceeds a critical level, base-pushout (Kirk effect) kicks in and the transistor and circuit speeds decrease rapidly as current is increased further.

BRIEF SUMMARY

Accordingly, aspects of the present invention include lateral BJT circuits to increase output power in RF and mmwave applications.

One example aspect of the present invention is an amplifier circuit including a substrate layer and a plurality of lateral bipolar junction transistors positioned entirely above the substrate. The lateral bipolar junction transistors include a plurality of monolithic emitter-collector regions coplanar to each other. Each of the emitter-collector regions is both an emitter region of a first bipolar junction transistor and a collector region of a second bipolar junction transistor from the lateral bipolar junction transistors. Accordingly, the lateral bipolar junction transistors are electrically coupled in series circuit at the emitter-collector regions.

Another example aspect of the present invention is an amplifier circuit including a substrate layer, a first lateral bipolar junction transistor, and a second lateral bipolar junction transistor. The first lateral bipolar junction transistor is positioned entirely above the substrate. The first lateral bipolar junction transistor includes a collector region, a first intrinsic base region, a first extrinsic base region electrically coupled to the first intrinsic base region, and a monolithic emitter-collector region configured to be an emitter of the first lateral bipolar junction transistor. The collector region and the emitter-collector region are coplanar to each other. The second lateral bipolar junction transistor is also positioned entirely above the substrate. The second lateral bipolar junction transistor includes an emitter region, a second intrinsic base region, a second extrinsic base region electrically coupled to the second intrinsic base region, and the monolithic emitter-collector region configured to be a collector of the second lateral bipolar junction transistor. The emitter region and the monolithic emitter-collector region are coplanar to each other.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

Figure 1:
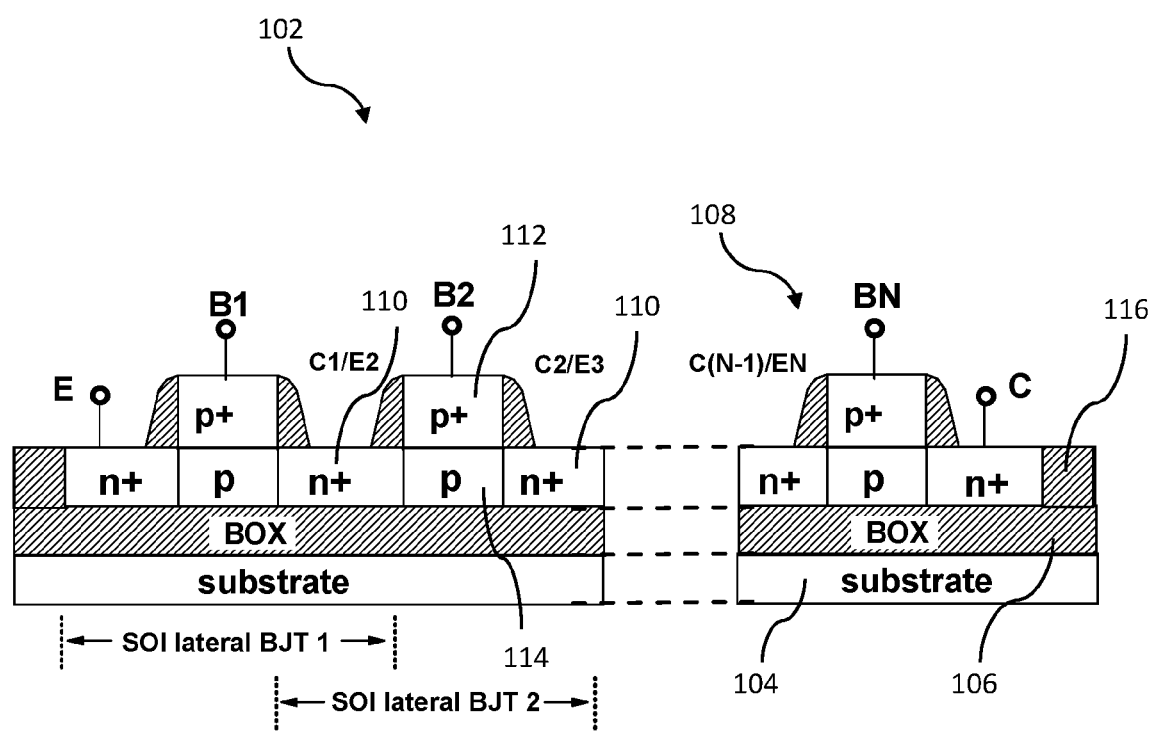
FIG. 1 shows an example amplifier circuit contemplated by the present invention.

The present invention is described with reference to embodiments of the invention. Throughout the description of the invention reference is made to FIGS. 1-11. When referring to the figures, like structures and elements shown throughout are indicated with like reference numerals.

An aspect of the present invention is a silicon-on-insulator (SOI) lateral bipolar transistor to form stacked bipolar transistor to increase output power from RF to mmwave and THz frequency while avoiding a collector-substrate breakdown limitation.

FIG. 1 shows an example amplifier circuit 102 contemplated by the present invention. The circuit 102 includes a substrate layer 104 and a buried oxide layer 106 entirely above, and in physical contact with, the substrate layer 104. In a particular embodiment, the substrate layer 104 is composed of silicon and the BOX layer is composed of silicon oxide.

The circuit 102 includes a plurality of SOI lateral bipolar junction transistors 108 positioned entirely above the substrate 104 and in physical contact with the BOX layer 106. The BOX layer 106 is positioned between the substrate layer 104 and the lateral bipolar junction transistors 108. Thus, each of the lateral bipolar junction transistors 108 is electrically isolated from the substrate layer 104 by the BOX layer 106. Furthermore, the BOX layer 106 acts to prevent collector-substrate breakdown at high supply voltages.

The lateral bipolar junction transistors 108 include a plurality of monolithic emitter-collector regions 110 coplanar to each other. Each of emitter-collector regions 110 is in physical contact with the BOX layer 106 along its entire length. Furthermore, each of the emitter-collector regions 110 acts as both an emitter region for a first bipolar junction transistor and a collector region for a second bipolar junction transistor. Thus, the lateral bipolar junction transistors 108 are electrically coupled in series circuit at the emitter-collector regions 110.

Unlike CMOS devices, stacking SOI lateral bipolar transistors do not present issues associated with any gate oxide breakdown. Here, the maximum emitter-collector voltage of the stack is limited by BVCEO of the individual transistors. Bipolar transistors are also faster than CMOS transistors. Therefore, a stacked SOI lateral bipolar transistor is far superior to a stacked CMOS device in terms of both speed and power efficiency.

Figure 2:
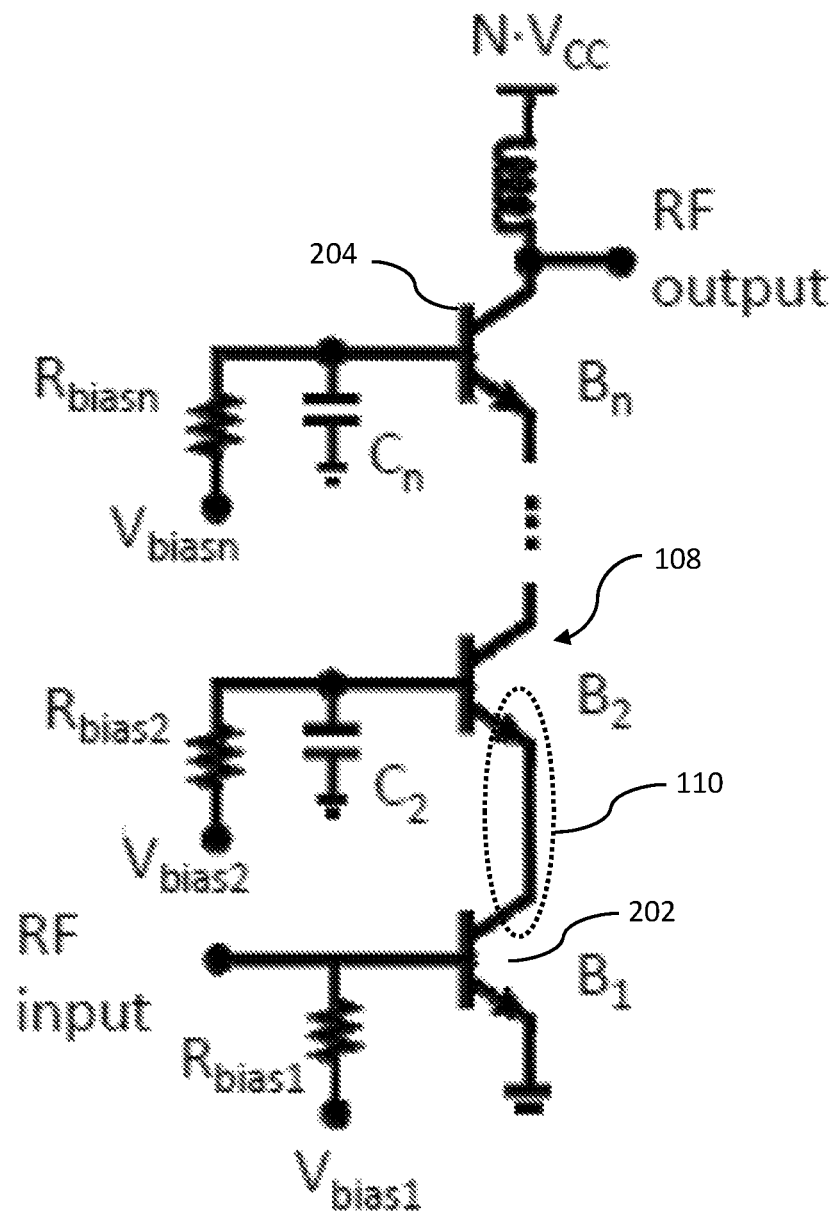
FIG. 2 shows a schematic diagram of the lateral bipolar junction transistors electrically coupled in series circuit at the emitter-collector regions, as contemplated by the present invention.

FIG. 2 shows a schematic diagram of the lateral bipolar junction transistors 108 electrically coupled in series circuit at the emitter-collector regions 110. The lateral bipolar junction transistors are configured to function as an RF power amplifier and driver. An input signal is coupled to a first base $B_1$ of an input transistor 202. The input transistor is biased to its quiescent active region by $V_{bias1}$ and $R_{bias1}$. Additional lateral bipolar junction transistors 108 are coupled in series circuit to the input transistor 202 at their respective emitter-collector regions 110. The additional lateral bipolar junction transistors 108 are biased using $V_{bias2}$ to $V_{biasn}$, $R_{bias2}$ to $R_{biasn}$, and $C_{bias2}$ to $C_{biasn}$, as shown. An output signal is supplied by an output transistor 204. It will be appreciated by those skilled in the art that the lateral bipolar junction transistors 108 effectively act as voltage dividers of the supply voltage $N \cdot V_{cc}$. The BOX layer 106 is used to prevent collector to substrate breakdown when $N \cdot V_{cc}$ is larger than the PN junction diode breakdown voltage.

Turning back to FIG. 1, each of the lateral bipolar junction transistors 108 includes an extrinsic base region 112 electrically coupled to an intrinsic base region 114. The intrinsic base 114 is configured to form an electric junction between the emitter-collector regions in a direction parallel to the length of the substrate layer 104. In one embodiment, the extrinsic base regions 112 are doped p+, the intrinsic base 114 is doped p and the emitter-collector regions 110 are doped n+. Thus, in this embodiment, the lateral bipolar junction transistors 108 are NPN transistors.

The amplifier circuit 102 may include one or more isolation trenches 116 configured to electrically isolate the lateral bipolar junction transistors 108 from electric interference generated elsewhere on the substrate. In one embodiment, the isolation trenches 116 extend down to the BOX layer 106. The isolation trenches 116 may be filled with dielectric material, such as silicon oxide.

Figure 3:
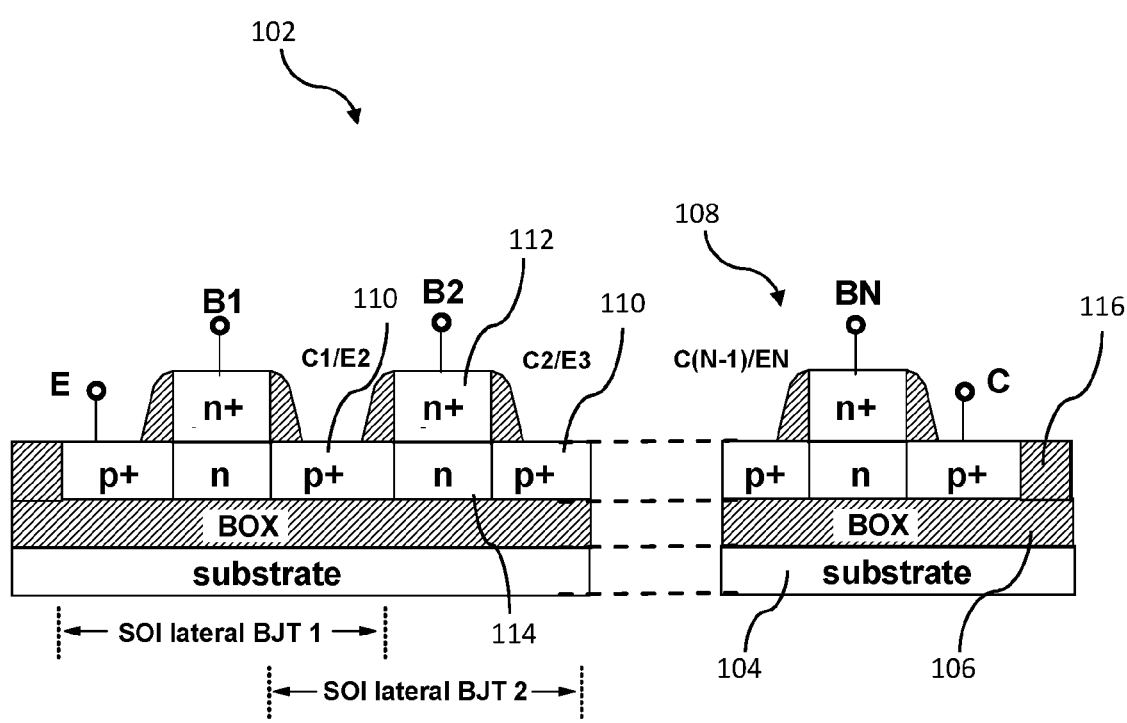
FIG. 3 another embodiment of the amplifier circuit contemplated by the present invention where the lateral bipolar junction transistors are PNP transistors.

FIG. 3 shows another embodiment of the amplifier circuit 102 contemplated by the present invention where the lateral bipolar junction transistors 108 are PNP transistors. In this configuration, the extrinsic base regions 112 can be doped n+, the intrinsic base region 114 can be doped n and the emitter-collector regions 110 can be doped p+. The PNP lateral bipolar junction transistors of FIG. 3 can be monolithically integrated with the NPN lateral bipolar junction transistors of FIG. 1 on the same substrate.

Figure 4:
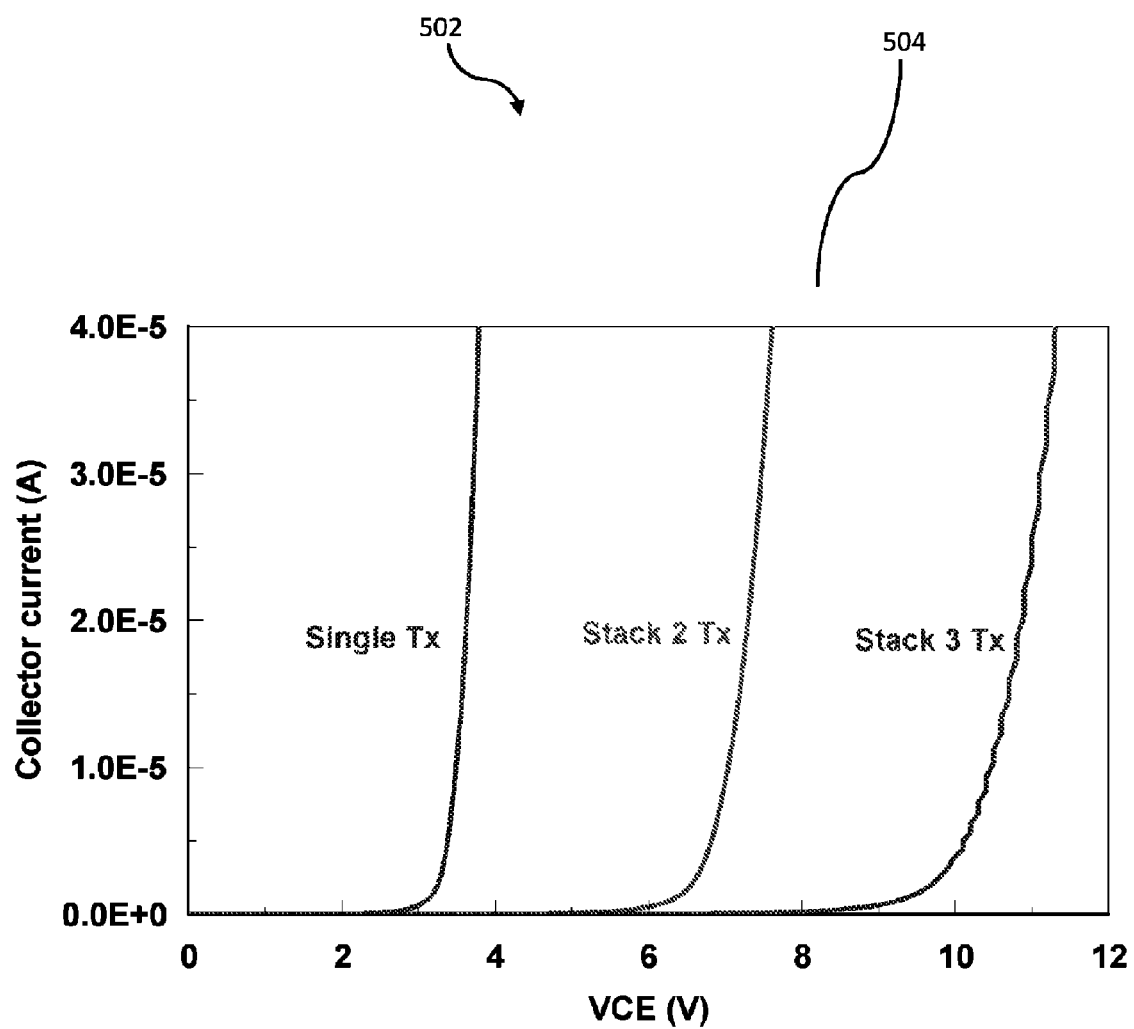
FIG. 4 shows the breakdown voltage between the collector and emitter at zero base current (BVCEO) for different transistor stacks.

FIG. 4 shows the breakdown voltage between the collector and emitter at zero base current (BVCEO) for different transistor stacks. As shown in the graph, BVCEO increases with the number of transistors in the transistor stack. Thus, the amplifier circuit 102 can be designed to overcome conventional BVCEO limitations by increasing the number of transistors in the transistor stack. Furthermore, the BOX layer 106 prevent collector-substrate breakdown at high Vcc voltages.

Figure 5:
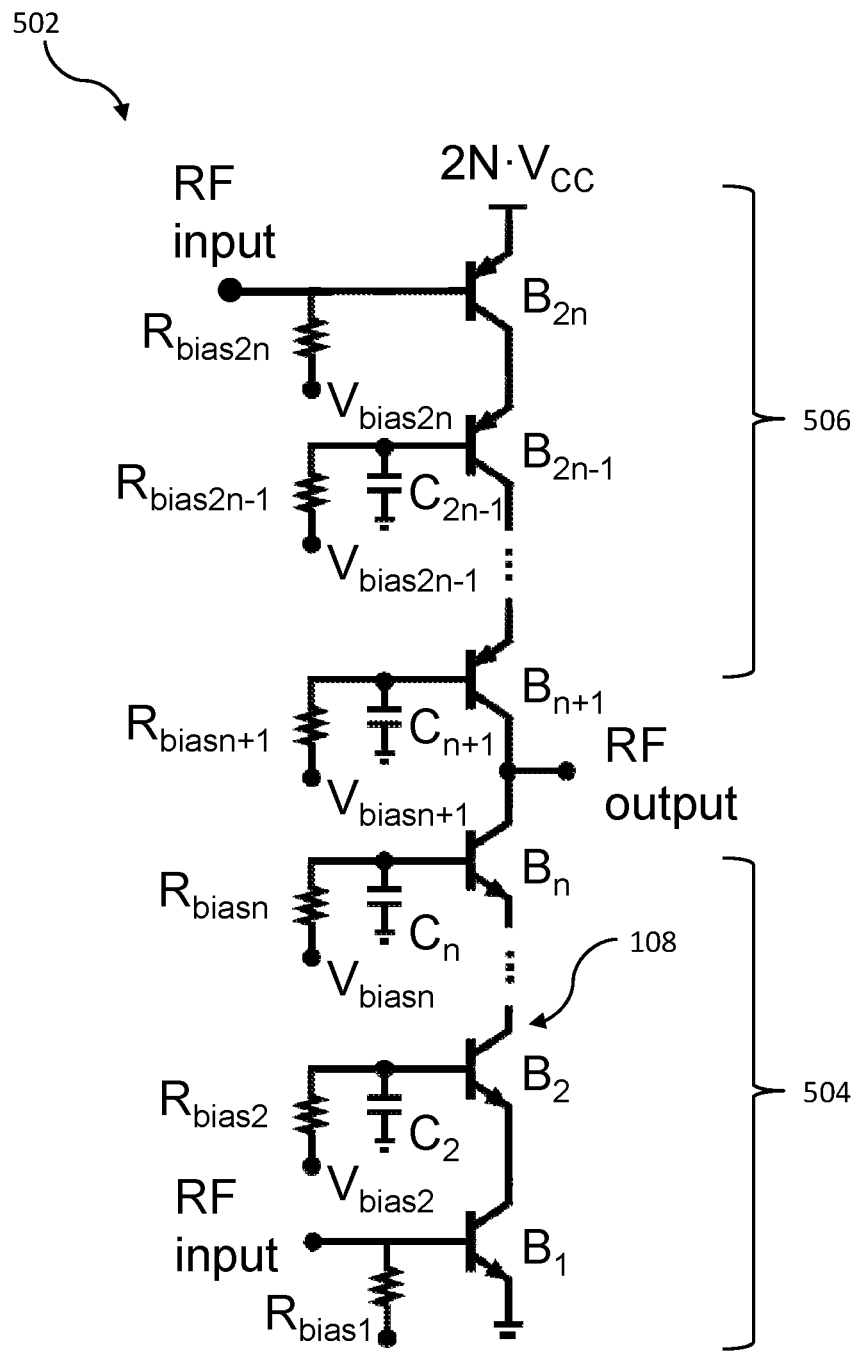
FIG. 5 shows another embodiment of the amplifier circuit contemplated by the present invention where the lateral bipolar junction transistors are configured to function as an RF push-pull power amplifier and driver, with the output connected to the collectors of the stacked NPN and stacked PNP transistors.

FIG. 5 shows another embodiment of the amplifier circuit 502 contemplated by the present invention where the lateral bipolar junction transistors are configured to function as an RF push-pull power amplifier and driver. In this configuration, amplifier circuit 502 includes a first set 504 of NPN transistors (see FIG. 1) and a second set 506 of PNP transistors (see FIG. 3).

The NPN and PNP transistors are stacked to divide the output voltage waveform by 2N. $C_2$ to $C_{2n}$ capacitors are used to have the proper voltage amplitude on the base terminal. The RF output is connected to the collectors of the NPN and PNP transistors. Furthermore, a SOI layer (e.g., BOX layer) is used so that there is no emitter-substrate or collector-substrate PN junction diodes and hence no issues associated with emitter-substrate or collector-substrate breakdown.

Figure 6:
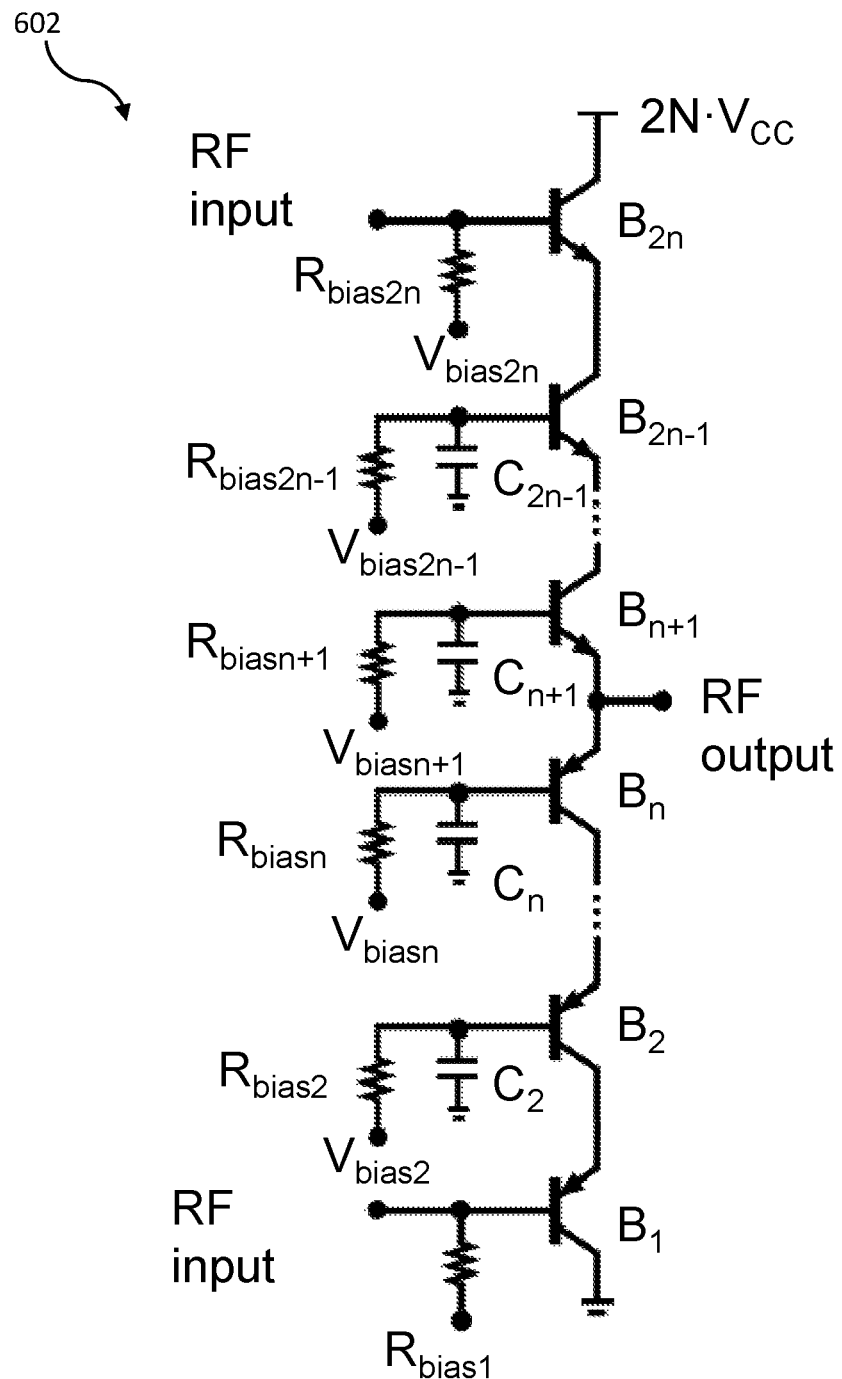
FIG. 6 shows another embodiment of the amplifier circuit contemplated by the present invention where the lateral bipolar junction transistors are configured to function as an RF push-pull power amplifier and driver, with the output connected to the emitters of the stacked NPN and stacked PNP transistors.

FIG. 6 shows another embodiment of the amplifier circuit 602 contemplated by the present invention where the lateral bipolar junction transistors are configured to function as an RF push-pull power amplifier and driver. In this configuration, the NPN and PNP transistors are stacked to divide the output waveform by 2N. $C_2$ to $C_{2n}$ capacitors are used to have the proper voltage amplitude on the base terminal. The RF output is connected to the emitters of the NPN and PNP transistors. Furthermore, a SOI layer (e.g., BOX layer) is used so that there is no emitter-substrate or collector-substrate PN junction diodes and hence no issues associated with emitter-substrate or collector-substrate breakdown.

Figure 7:
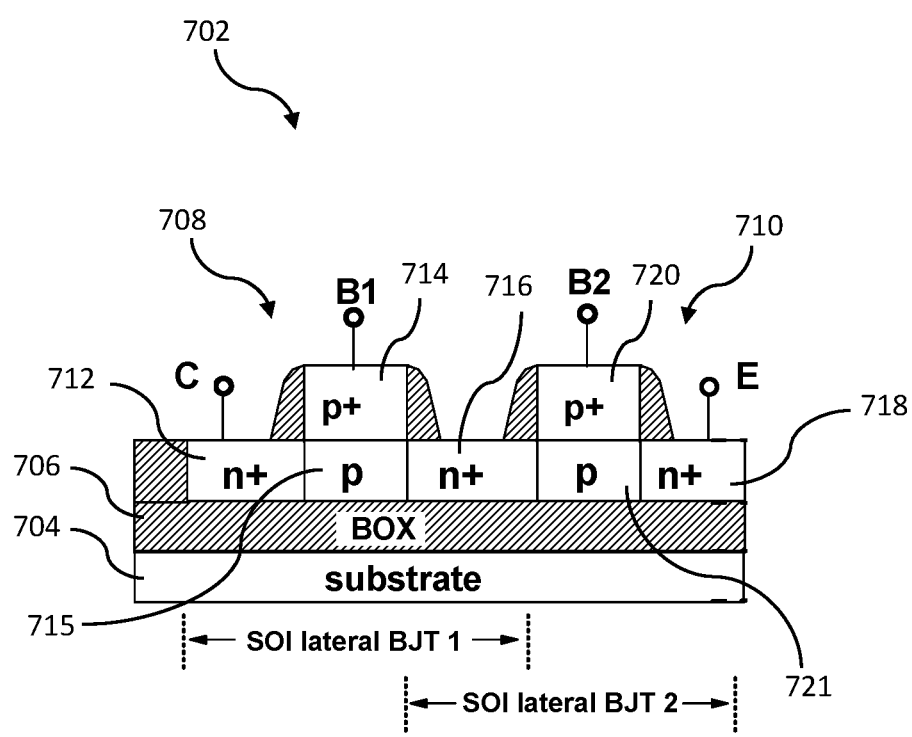
FIG. 7 shows a further example of an amplifier circuit contemplated by the present invention.

FIG. 7 shows another example amplifier circuit 702 contemplated by the present invention. The amplifier circuit 702 includes a substrate layer 704 and a BOX layer 706. The BOX layer 706 is positioned entirely above the substrate layer 704.

A first lateral BJT 708 and a second lateral BJT 710 are positioned entirely above the BOX layer 706. The first lateral BJT 708 includes a collector region 712, a first extrinsic base region 714, a first intrinsic base region 715 and a monolithic emitter-collector region 716. The emitter-collector region 716 is configured to be an emitter of the first lateral BJT 708. The first extrinsic base region 714 is electrically coupled to the first intrinsic base region 715. The first intrinsic base region 715 is configured to form a first electric junction between the collector region 712 and the emitter-collector region 716 in a direction parallel to a length of the substrate layer 704. In addition, the collector region 712 and the monolithic emitter-collector region 716 are coplanar to each other.

The second lateral BJT 710 includes an emitter region 718, a second extrinsic base region 720, a second intrinsic base region 721 and the monolithic emitter-collector region 716. The emitter-collector region 716 is configured to be a collector of the second lateral BJT 710. The second extrinsic base region 720 is electrically coupled to the second intrinsic base region 721. The second intrinsic base region 721 is configured to form a second electric junction between the emitter region 718 and the emitter-collector region 716 in the direction parallel to the length of the substrate layer 704. Furthermore, the emitter region 718 and the monolithic emitter-collector region 716 are coplanar to each other.

The BOX layer 706 is located between substrate layer 704 and the first and second lateral BJTs 708, 710. Thus, the first lateral BJT 708 and the second lateral BJT 710 are electrically isolated from the substrate layer 704 by the BOX layer 706. As shown, the BOX layer 706 is in physical contact with the collector region 712, the emitter region 718, the intrinsic base regions 715 and 721 and the monolithic emitter-collector region 716. Furthermore, the collector region 712, the emitter region 718 and the monolithic emitter-collector region 716 are in physical contact with the BOX layer 706 entirely along their respective lengths.

In one embodiment, the first extrinsic base region 714 and the second extrinsic base region 720 are doped p+, the first intrinsic base region 715 and the second intrinsic base region 721 are doped p, and the collector region 712, the emitter region 718 and the emitter-collector region 716 are doped n+. In another embodiment, the first extrinsic base region 714 and the second extrinsic base region 720 are doped n+, the first intrinsic base region 715 and the second base region 721 are doped n, and the collector region 712, the emitter region 718 and the emitter-collector region 716 are doped p+. Those skilled in the art will understand that the first and second lateral BJTs 708 and 710 may be PNP transistors.

Figure 8:
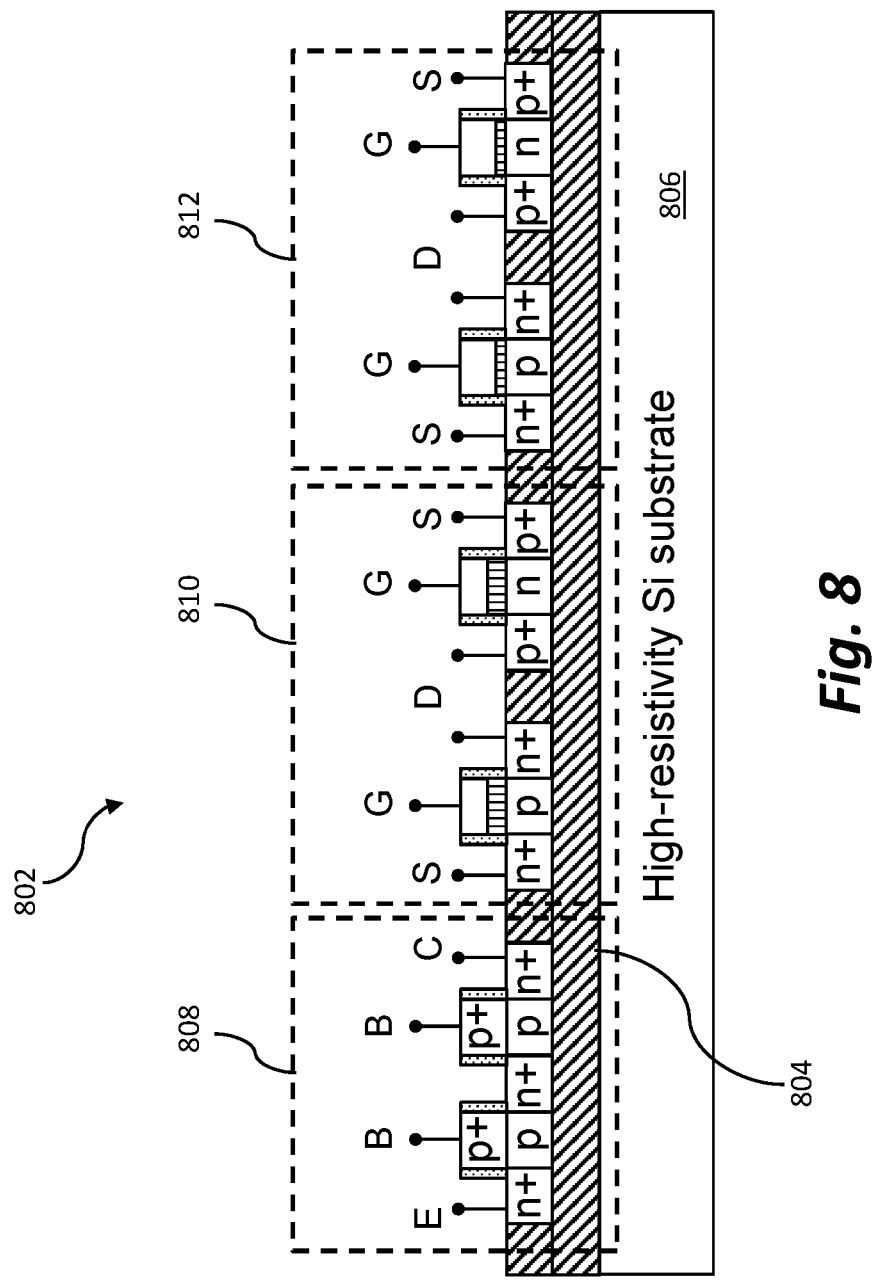
FIG. 8 shows another example amplifier circuit with at least one complementary metal-oxide-semiconductor (CMOS) circuit fabricated on a buried oxide layer.

FIG. 8 shows another example amplifier circuit 802 contemplated by the present invention. In this embodiment, at least one complementary metal-oxide-semiconductor (CMOS) circuit is fabricated on the buried oxide layer 804 and above the substrate 806. Specifically, the lateral SOI bipolar junction transistor stack 808 can be integrated with extra masks and technology steps to include thin and/or thick oxide CMOS transistors, such as NFETs and PFETs. Substrate 806 can be a high resistivity substrate, with resistivity about 10 kΩ-cm or larger. By using SOI high resistivity substrates, the BJT and field effect transistor (FET) devices can be stacked and biased at higher voltages than their respective breakdown voltage. For RF switches, stacked thick gate dielectric (such as $SiO_2$), high-voltage FETs 810 can be used. VLSI and mmwave switches with lower "on" resistance can be achieved with stacked thin gate dielectric, low-voltage FETs 812. Integrating stacked BJTs 808, thick oxide FETs 810, and thin oxide FETs 812 on a high resistivity substrate, such as a buried oxide layer 804, allows a variety of functions to be achieved on a single chip.

Figure 9:
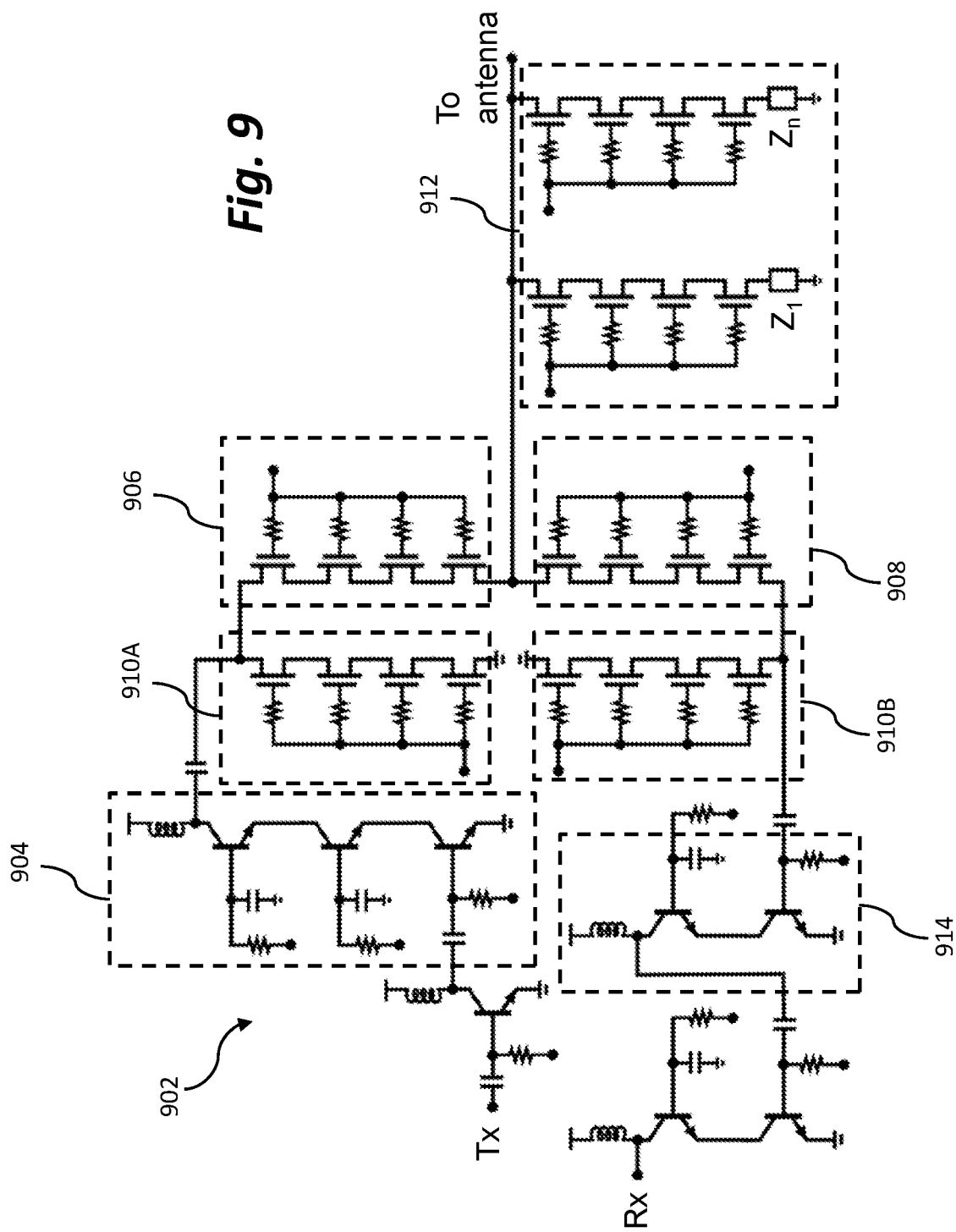
FIG. 9 shows an example transceiver circuit integrating both stacked BJTs and CMOS devices, as contemplated by the present invention.

FIG. 9 shows an example transceiver circuit 902 integrating both stacked BJTs and CMOS devices, as contemplated by the present invention. The transceiver circuit 902 includes a transmit-side power amplifier 904 configured to amplify the transmit signal Tx. The power amplifier 904 includes a plurality of lateral BJTs electrically configured in a common emitter circuit and stacked at the emitter-collector regions to increase the output power and efficiency of the transceiver circuit 902.

The transmit signal output from the power amplifier 904 is coupled to a transmit switch 906. The transmit switch 906 is a stacked FET switch. Thus, as shown, the CMOS transistors are stacked in series circuit such that a source gate of one CMOS transistor is electrically coupled to a drain gate of another CMOS transistor. This example targets a mmwave design where the thin oxide FET used for switches has a lower breakdown voltage than the lateral bipolar (that is why more FETs are used to sustain the high voltage waveform coming out of the power amplifier 904). When active, the transmit switch 906 passes the transmit signal to an antenna. The transmit switch 906, along with a receive switch 908, allows one antenna to be shared by both a transmit circuit and a receive circuit. Both the transmit and receive circuits may include shunt switches 910A and 910B to improve signal isolation. It is contemplated that more complex architectures can be used, such as more shunt or series switches, as well as switches using quarter-wavelength transmission lines with FET or bipolar devices.

The output of the transmit switch 906 and the input of the receive switch 908 are both connected to an impedance tuner circuit 912. The impedance tuner circuit 912 consists of a series of stacked FET switches connected to different impedance loads. The antenna impedance and the transceiver circuit impedance can be matched by selecting an appropriate combination of impedance loads at the impedance tuner circuit 912. The impedance tuner circuit 912 can help tune the antenna and package to get the maximum power transmitted to the antenna by turning on and off the impedances Z1 to Zn (i.e., capacitors, inductors or transmission lines), thereby improving the efficiency of the transceiver circuit 902.

The receive circuit includes a receive-side low noise amplifier 914 coupled to the receive switch 908. The low noise amplifier 914 includes a plurality of lateral BJTs electrically configured as a common emitter circuit and stacked at the emitter-collector regions, as discussed above, to improve signal linearity.

Integration of the stacked BJTs (power amplifier 904 and low noise amplifier 914) and stacked FETs (antenna switches 906, 908 and impedance tuner 912) on the same chip is achieved by fabricating SOI on high-resistivity substrate technology. It is noted that more stacked devices can be used in transceiver circuit 902 to sustain a higher supply voltage, increase efficiency, and provide additional functionality.

Figure 10:
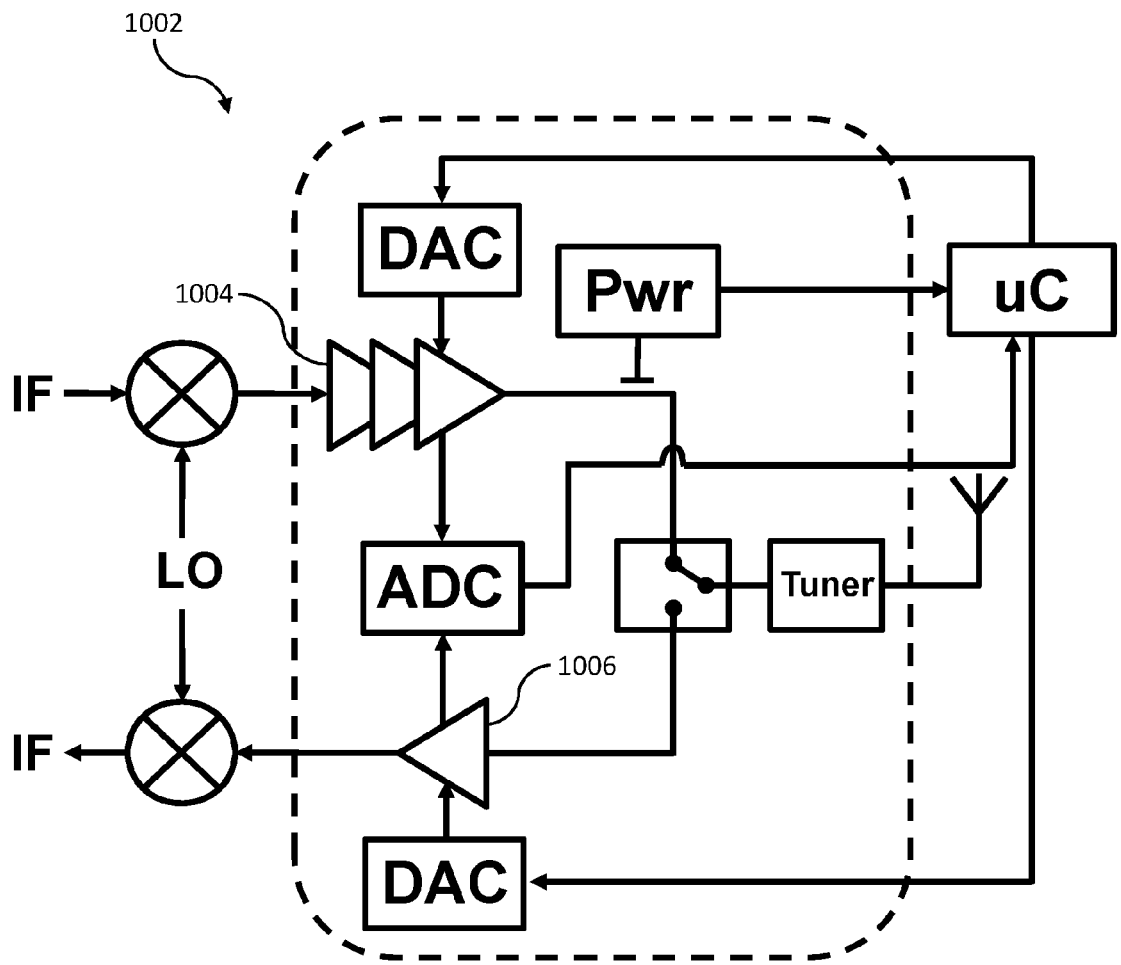
FIG. 10 shows an example of an adaptive transceiver system contemplated by the present invention.

FIG. 10 shows an example of an adaptive transceiver system 1002 contemplated by the present invention. The system 1002 includes a transmit-side power amplifier 1004 and a receive-side low noise amplifier 1006, as described above. A power detector (Pwr) is used to detect the power generated by the power amplifier 1004. A microcontroller (uC) can monitor and adjust the biasing points of the power amplifier 1004 and the low noise amplifier 1006 through digital to analog converters (DACs) and analog to digital converters (ADCs). Mixers, using a local oscillator (LO), can inject and extract an intermediate frequency (IF) signal to and from a high frequency radio signal. It is contemplated that the adaptive transceiver system 1002 can be integrated into a single chip.

Figure 11:
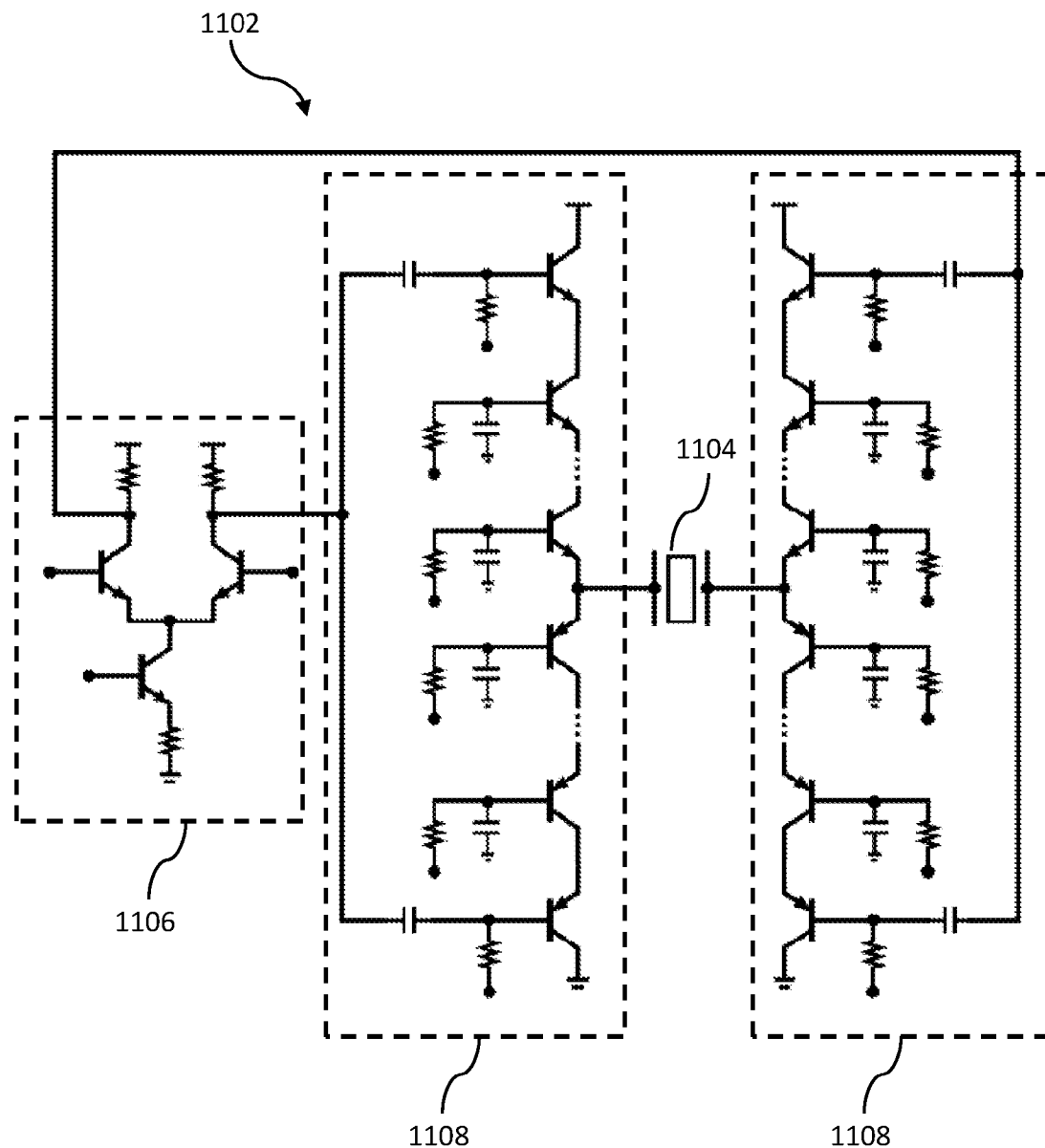
FIG. 11 shows an example of an ultrasound driver circuit using stacked BJTs, as contemplated by the present invention.

FIG. 11 shows an example of an ultrasound driver circuit 1102 using stacked BJTs, as contemplated by the present invention. The ultrasound driver circuit 1102 can drive an ultrasound transducer 1104, which typically requires a signal amplitude from 5V to 20V.

The driver circuit 1102 includes a differential amplifier 1106 that receives an in-phase ultrasound input signal and an out of phase ultrasound input signal. The output signal from the differential amplifier 1106 drives two push-pull amplifiers 1108 in a differential manner. Thus, the output signals from the push-pull amplifiers 1108 are out of phase by 180 degrees. Each push-pull amplifier 1108 includes a plurality of lateral BJTs stacked at the emitter-collector regions, as discussed above.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An amplifier circuit comprising:
   a substrate layer; and
   a plurality of lateral bipolar junction transistors positioned entirely above the substrate layer, the lateral bipolar junction transistors including a plurality of monolithic emitter-collector regions coplanar to each other, each of the emitter-collector regions is a continuous physical region with a single doping profile and is both an emitter region of a first bipolar junction transistor from the lateral bipolar junction transistors and a collector region of a second bipolar junction transistor from the lateral bipolar junction transistors such that the lateral bipolar junction transistors are electrically coupled in series circuit at the emitter-collector regions.

2. The amplifier circuit of claim 1, further comprising a buried oxide layer entirely above the substrate layer and entirely below the lateral bipolar junction transistors, the buried oxide layer is in physical contact with the substrate layer and each of the lateral bipolar junction transistors.

3. The amplifier circuit of claim 2, wherein each of emitter-collector regions is in physical contact with the buried oxide layer along its entire length.

4. The amplifier circuit of claim 2, wherein each of the lateral bipolar junction transistors is electrically isolated from the substrate layer by the buried oxide layer.

5. The amplifier circuit of claim 1, wherein each of the lateral bipolar junction transistors includes an extrinsic base region and an intrinsic base region, the extrinsic base region is electrically coupled to the intrinsic base region, the intrinsic base region configured to form an electric junction between the emitter-collector regions in a direction parallel to a length of the substrate layer.

6. The amplifier circuit of claim 5, wherein extrinsic base regions of the lateral bipolar junction transistors are doped p+, the intrinsic base regions are doped p, and the emitter-collector regions are doped n+.

7. The amplifier circuit of claim 5, wherein extrinsic base regions of the lateral bipolar junction transistors are doped n+, the intrinsic base regions are doped n, and the emitter-collector regions are doped p+.

8. The amplifier circuit of claim 1, wherein the lateral bipolar junction transistors include a first set of NPN transistors and a second set of PNP transistors.

9. The amplifier circuit of claim 1, wherein the lateral bipolar junction transistors are configured to function as an RF power amplifier and driver.

10. The amplifier circuit of claim 1, wherein the lateral bipolar junction transistors are configured to function as an RF push-pull power amplifier and driver.

11. The amplifier circuit of claim 1, further comprising:
    a first stack of the lateral bipolar junction transistors configured as a first amplifier and receiving a first input signal; and
    a second stack of the lateral bipolar junction transistors configured as a second amplifier and receiving a second input signal that is 180 degrees out of phase from first input signal.

12. The amplifier circuit of claim 1, further comprising:
    a buried oxide layer positioned between the substrate layer and the lateral bipolar junction transistors, the buried oxide layer is in physical contact with the substrate layer and each of the lateral bipolar junction transistors; and
    metal-oxide-semiconductor (CMOS) transistors fabricated on the buried oxide layer.

13. The amplifier circuit of claim 12, wherein a plurality of the CMOS transistors is stacked in series circuit such that a source gate of a first CMOS transistor is electrically coupled to a drain gate of second CMOS transistor.

14. An amplifier circuit comprising:
    a substrate layer;
    a first lateral bipolar junction transistor positioned entirely above the substrate layer, the first lateral bipolar junction transistor including a collector region, a first intrinsic base region, a first extrinsic base region electrically coupled to the first intrinsic base region, and a monolithic emitter-collector region with a single doping profile configured to be an emitter of the first lateral bipolar junction transistor, the collector region, the first intrinsic base region and the emitter-collector region are coplanar to each other; and
    a second lateral bipolar junction transistor positioned entirely above the substrate, the second lateral bipolar junction transistor including an emitter region, a second intrinsic base region, a second extrinsic base region electrically coupled to the second intrinsic base region, and the monolithic emitter-collector region configured to be a collector of the second lateral bipolar junction transistor, the emitter region, the second intrinsic base region and the monolithic emitter-collector region are coplanar to each other.

15. The amplifier circuit of claim 14, further comprising a buried oxide layer entirely above the substrate layer, the buried oxide layer in physical contact with the collector region, the first and second intrinsic base regions, the emitter region and the monolithic emitter-collector region.

16. The amplifier circuit of claim 15, wherein the collector region, the first and second intrinsic base regions, the emitter region and the monolithic emitter-collector region are in physical contact with the buried oxide layer entirely along their respective lengths.

17. The amplifier circuit of claim 15, wherein the first lateral bipolar junction transistor and the second lateral bipolar junction transistor are electrically isolated from the substrate layer by the buried oxide layer.

18. The amplifier circuit of claim 14, further comprising:
wherein the first intrinsic base region is configured to form a first electric junction between the collector region and the emitter-collector region in a direction parallel to a length of the substrate layer; and
wherein the second intrinsic base region is configured to form a second electric junction between the emitter region and the emitter-collector region in the direction parallel to the length of the substrate layer.

19. The amplifier circuit of claim 14, wherein the first extrinsic base region and the second extrinsic base region are doped p+, the first intrinsic base region and the second intrinsic base region are doped p and the collector region, the emitter region and the emitter-collector region are doped n+.

20. The amplifier circuit of claim 14, wherein the first extrinsic base region and the second extrinsic base region are doped n+, the first intrinsic base region and the second intrinsic base region are doped n and the collector region, the emitter region and the emitter-collector region are doped p+.

* * * * *